(12) United States Patent
Koretsune et al.

(10) Patent No.: US 7,510,980 B2
(45) Date of Patent: Mar. 31, 2009

(54) METHOD FOR MANUFACTURING SEMICONDUCTOR DEVICE

(75) Inventors: Toshihisa Koretsune, Kawasaki (JP); Masato Fujita, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/602,180

(22) Filed: Nov. 21, 2006

(65) Prior Publication Data

US 2007/0117395 A1    May 24, 2007

(30) Foreign Application Priority Data

Nov. 24, 2005   (JP)   ............... 2005-338991

(51) Int. Cl.
*H01L 21/302* (2006.01)
(52) U.S. Cl. .................. 438/736; 438/448; 438/551; 438/636; 438/671; 438/700; 438/717; 438/942; 430/5; 430/394
(58) Field of Classification Search ........... 438/448, 438/551, 636, 671, 700, 717, 736, 942; 430/5, 430/394
See application file for complete search history.

(56) References Cited

U.S. PATENT DOCUMENTS

| | | | | | |
|---|---|---|---|---|---|
| 5,330,862 | A | * | 7/1994 | Tabuchi et al. .............. | 430/5 |
| 5,380,609 | A | * | 1/1995 | Fujita et al. ................ | 430/5 |
| 5,419,988 | A | * | 5/1995 | Mohri et al. ................ | 430/5 |
| 5,688,617 | A | * | 11/1997 | Mikami et al. .............. | 430/5 |
| 6,204,187 | B1 | * | 3/2001 | Rupp et al. ................ | 438/702 |
| 6,573,027 | B1 | * | 6/2003 | Imai ........................ | 430/311 |
| 6,660,462 | B1 | * | 12/2003 | Fukuda ..................... | 430/394 |

FOREIGN PATENT DOCUMENTS

JP    2000-227652    8/2000

* cited by examiner

*Primary Examiner*—Andy Huynh
(74) *Attorney, Agent, or Firm*—Young & Thompson

(57) ABSTRACT

A method for manufacturing a semiconductor device of the present invention includes: forming a first film, a second film and a third film in sequence on a silicon substrate; patterning a resist film formed on the third film by conducting an exposure and developing process for the resist film employing an exposure mask including a phase shifter; selectively dry-etching the third film through a mask of the resist film employing the second film as an etch stop to process the third film into a first pattern; further dry-etching the third film employing the second film as an etch stop to partially remove the third film, thereby processing the third film into a second pattern; patterning the second film employing the third film having the second pattern as a mask; and patterning the first film employing the patterned second film as a mask.

4 Claims, 12 Drawing Sheets

FIG. 10A
(RELATED ART)
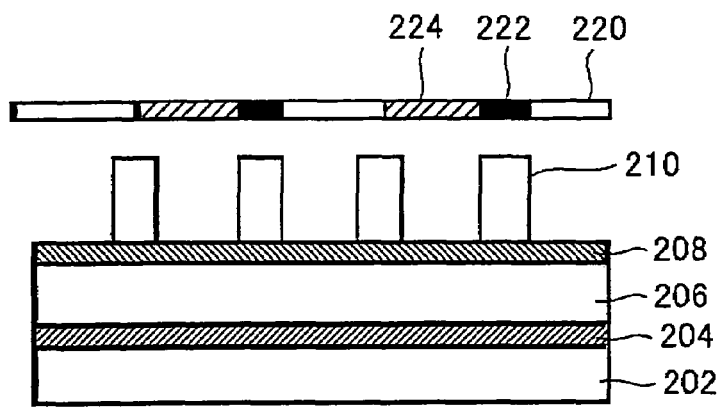
FIG. 10B
(RELATED ART)
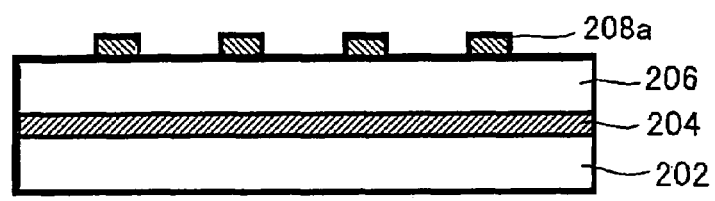
FIG. 10C
(RELATED ART)

METHOD FOR MANUFACTURING SEMICONDUCTOR DEVICE

This application is based on Japanese patent application No. 2005-338,991, the content of which is incorporated hereinto by reference.

BACKGROUND

1. Technical Field

The present invention relates to a method for manufacturing a semiconductor device having a certain pattern formed with a phase shifting mask.

2. Related Art

In recent years, miniaturization in a gate interconnect pattern is required under a circumstance of increasing integration of semiconductor chips. A patterning process employing a Levenson phase shifting mask is one of effective measures for achieving the above-described miniaturization. Nevertheless, since an use of a Levenson phase shifting mask can only provides a continuous line and space (line/space) pattern, it is necessary for forming a desired pattern to remove unwanted pattern that is created by a Levenson-exposure process.

Typical processes for manufacturing semiconductor devices in the conventional technology include, for example, a technology described in Japanese Patent Laid-Open No. 2000-227,652. Cross-sectional views of a semiconductor device for illustrating a process for manufacturing the semiconductor device described in Japanese Patent Laid-Open No. 2000-227,652 is shown in FIGS. 10A to 10C and FIGS. 11A and 11B.

As shown in FIG. 10A, a gate oxide film 204 is first formed on a silicon substrate 202, and a polycrystalline silicon film 206 are formed thereon. Further, a silicon oxide film 208 for hard mask formation is formed thereon, and then, a positive resist film (not shown) is formed thereon.

A first exposure and developing processes are conducted over such positive resist film through a Levenson phase shifting mask 220. In this case, light is not irradiated over regions of the Levenson phase shifting mask 220 corresponding to an edge of a phase shifter 224 and line-light shielding 222, such that a patterned resist film 210 is formed to have a predetermined geometry (FIG. 10A).

Then, the silicon oxide film 208 is etched through a mask of such resist film 210 to form on polycrystalline silicon film 206 a silicon oxide film 208a, on which a mask pattern is transferred (FIG. 10B). Then, a positive resist film (not shown) is formed so as to cover the polycrystalline silicon film 206 and the silicon oxide film 208a, and then, a second exposure and developing processes are conducted through an exposure mask 226. This provides that only a portion of the silicon oxide film 208a corresponding to the gate pattern to be formed is coated with the protective resist film 212 (FIG. 10C).

Next, rest of the silicon oxide film 208a, which is not coated with the protective resist film 212, is removed via an etch process. Subsequently, the protective resist film 212 is removed to obtain a desired silicon oxide film 208b corresponding to the gate pattern to be formed (FIG. 11A). Then, an etch process for the polycrystalline silicon film 206 is conducted through a mask of such silicon oxide film 208b. This provides a formation of the polycrystalline silicon film 206a, which is a gate pattern corresponding to the silicon oxide film 208b (FIG. 11B).

Nevertheless, there is a room for improvement in the process described in Japanese Patent Laid-Open No. 2000-227,652 that a desired semiconductor device can not obtained since an unexpected pattern is transferred onto the surface of the polycrystalline silicon film 206 in operations illustrated in FIG. 10C and FIG. 11A. This will be further described in reference to FIGS. 12A to 12D.

As shown in FIG. 12A, the second exposure and developing processes are conducted to provide a status, in which only the portions of the silicon oxide film 208a corresponding to the gate pattern to be formed are coated with the protective resist film 212. Next, an etch process for removing unwanted silicon oxide film 208a is conducted. On this occasion, the surface of the exposed polycrystalline silicon film 206 is etched. This causes transferring an unexpected pattern to an exposed portion "A" in the polycrystalline silicon film 206, so that a difference is created in film thickness between the exposed portion "A" and a coated portion "B" with the protective resist film 212 (FIG. 12B).

Next, the polycrystalline silicon film 206 is etched through a mask of the silicon oxide film 208b patterned with a desired hard mask pattern. Since the exposed portion A, which is not coated with the protective resist film 212, is thinner than the coated portion B, which is coated with the protective resist film 212, in the second exposure and developing processes on this occasion, the gate oxide film 204 is first exposed at the exposed portion A (FIG. 12C).

The portion of the polycrystalline silicon film 206a is remained in the coated portion B that is coated with the protective resist film 212, as shown in FIG. 12C, and therefore further etch process is conducted until the gate oxide film 204 is exposed. Such etch process causes an excessive etch for the exposed portion A of the polycrystalline silicon film 206a that is not coated with the protective resist film 212, resulting in proceeding the etching until the gate oxide film 204 is etched, and further proceeding the etching until the silicon substrate 202 is exposed (FIG. 12D).

Further, in recent years, requirements in achieving an increasing operation speed and higher performances of the transistors promote further reduction in the film thickness of the gate oxide film, and thus process allowances for etching the gate oxide film is reduced. Therefore, it is manifested that the etching is proceeded until the silicon substrate is etched, causing a gate leakage current and/or a short-circuit in the obtained semiconductor device.

As described above, when a hard mask disposed on a surface of a first film such as a polycrystalline silicon and composed of a silicon oxide film having an unwanted pattern formed thereon is etched off, the first film may be also etched during the etching for the hard mask, thereby forming an unexpected pattern on the first film. Therefore, an unexpected pattern may be transferred onto the silicon substrate in later operations, causing a generation of a gate leakage current or a short-circuit.

SUMMARY OF THE INVENTION

According to one aspect of the present invention, there is provided a method for manufacturing a semiconductor device, comprising: forming a first film, a second film and a third film in sequence on a silicon substrate; forming a resist film on the third film; patterning the resist film by conducting an exposure and developing process for the resist film employing an exposure mask comprising a phase shifter; selectively dry-etching the third film through a mask of the resist film employing the second film as an etch stop to process the third film into a first pattern; further dry-etching the third film employing the second film as an etch stop to partially remove the third film, thereby processing the third film into a second pattern; patterning the second film through a mask of the third film having the second pattern; and patterning the first film employing the patterned second film as a mask.

According to the above-described method for manufacturing the semiconductor device, an unwanted patterned mask formed in employing the exposure mask comprising the phase shifter is removed via dry etch process on the second film that serves as an etch stop. Therefore, no unexpected pattern is formed on the surface of the first film. This configuration can prevents the silicon substrate or the like from being transferred with an unexpected pattern, thereby inhibiting a deterioration in properties such as a generation of a gate leakage current, a short-circuit and the like.

According to the present invention, a method for manufacturing a semiconductor device, which provides an inhibition of a deterioration in properties such as a generation of a gate leakage current, a short-circuit and the like, is provided.

BRIEF DESCRIPTION OF THE DRAWINGS

The above and other objects, advantages and features of the present invention will be more apparent from the following description taken in conjunction with the accompanying drawings, in which:

FIGS. 10A to 10C are cross-sectional views of a semiconductor device, illustrating a conventional process for manufacturing the semiconductor device;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and redundant descriptions thereof will not be repeated.

Embodiments of the present invention will be described as referring to first to third embodiments as follows.

First Embodiment

Figure 1A:
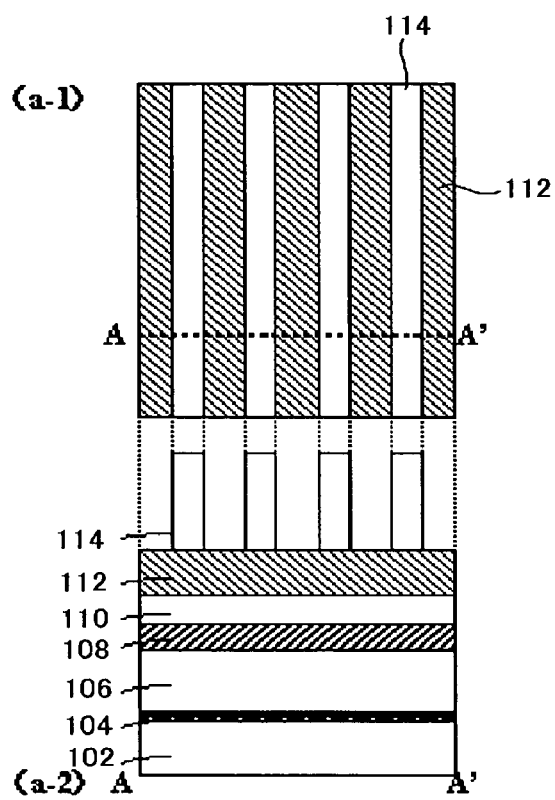
FIGS. 1A and 1B include plan views and cross-sectional views of a semiconductor device, illustrating a method for manufacturing the semiconductor device of first embodiment.
Figure 1B:
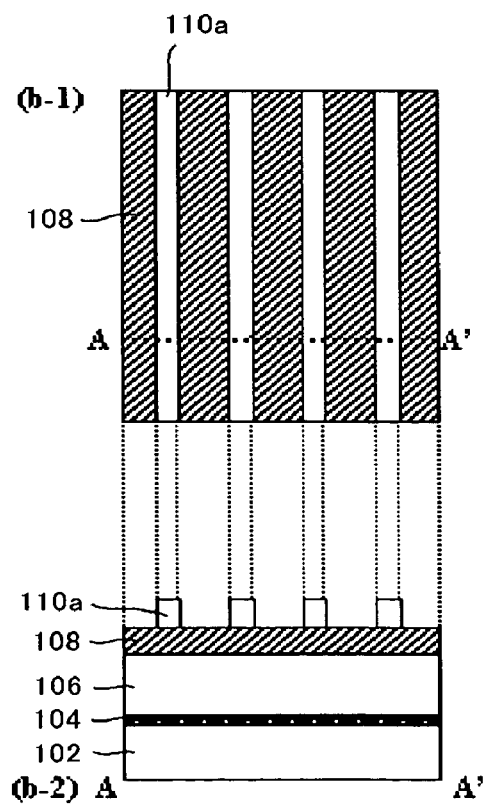
Figure 2A:
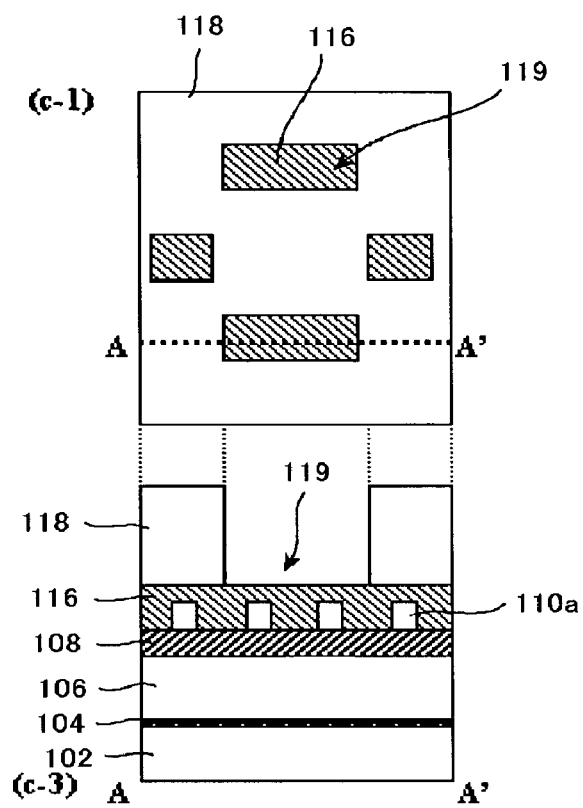
FIGS. 2A and 2B include plan views and cross-sectional views of the semiconductor device, illustrating the method for manufacturing the semiconductor device of first embodiment.
Figure 2B:
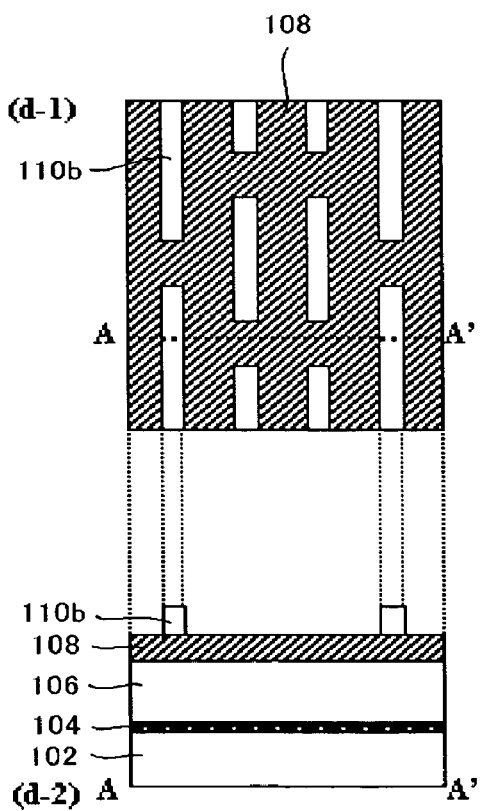
Figure 3A:
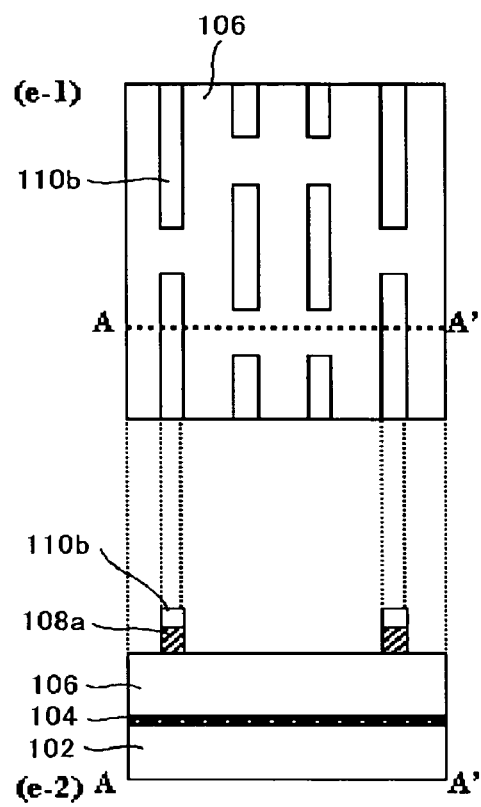
FIGS. 3A and 3B include plan views and cross-sectional views of the semiconductor device, illustrating the method for manufacturing the semiconductor device of first embodiment.
Figure 3B:
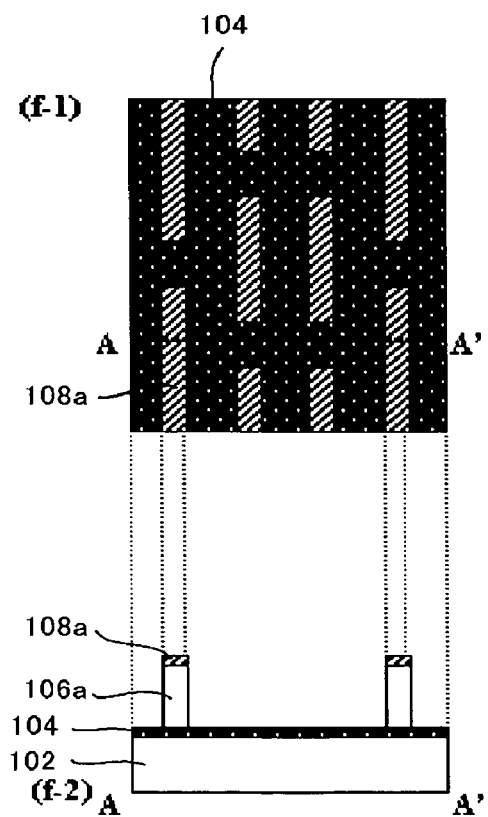

A method for manufacturing a semiconductor device of the present embodiment includes the following operations:

(i) forming a first film (polycrystalline silicon film 106), a second film (silicon oxide film 108) and a third film (polycrystalline silicon film 110) in sequence on a silicon substrate 102 (FIG. 1A);

(ii) forming a resist film on the polycrystalline silicon film 110 (FIG. 1A);

(iii) patterning the aforementioned resist film by conducting an exposure and developing process for the aforementioned resist film employing an exposure mask comprising a phase shifter (FIG. 1A);

(iv) selectively dry-etching the polycrystalline silicon film 110 through a mask of the resist film 114 employing the silicon oxide film 108 as an etch stop to process the polycrystalline silicon film 110 into a first pattern (FIG. 1B);

(v) further dry-etching the polycrystalline silicon film 110a employing the silicon oxide film 108 as an etch stop to partially remove the polycrystalline silicon film 110a, thereby processing the polycrystalline silicon film 110a into a second pattern (FIGS. 2A and 2B);

(vi) patterning the silicon oxide film 108 through a mask of the polycrystalline silicon film 110b having the second pattern (FIG. 3A); and (vii) patterning the first film 106 employing the patterned silicon oxide film 108a as a mask (FIG. 3B).

First embodiment will be further described along respective operating steps as follows. Each of FIGS. 1A and 1B, FIGS. 2A and 2B and FIGS. 3A and 3B contains a plan view [(a-1) to (f-1)] and a cross-sectional view [(a-2) to (f-2)] of a semiconductor device of the present embodiment, respectively, illustrating a method for manufacturing the semiconductor device of the present embodiment by respective process sequences.

As shown in FIG. 1A, a gate oxide film 104 and a polycrystalline silicon film 106 are sequentially deposited on the silicon substrate 102. Further, the silicon oxide film 108 for forming a hard mask, the polycrystalline silicon film 110, an anti-reflection film 112 and a resist film (not shown) are formed thereon. Then, the resist film is exposed and developed through a Levenson phase shifting mask (not shown) to form a patterned first resist film 114 (FIG. 1A). Here, as the Levenson phase shifting mask is used, the first resist film 114 is formed to have a continuous line and space (line/space) pattern that includes unnecessary parts.

Next, the anti-reflection film 112 and the polycrystalline silicon film 110 are selectively dry etched through a mask of the first resist film 114 employing the silicon oxide film 108 as an etch stop. Then, the first resist film 114 and the anti-reflection film 112 are stripped off via an ordinary process to provide the processed polycrystalline silicon film 110, which is processed into the first pattern (FIG. 1B).

In general, when a polysilicon etching apparatus is employed for the dry etch apparatus, larger etch selectivity of polycrystalline silicon film 110/silicon oxide film 108 can be selected. This provides a selective etching of the polycrystalline silicon film 110 without creating any cutting in the film surface of the silicon oxide film 108. Typical etchant gases include, for example, a gaseous mixture of chlorine gas and oxygen gas ($Cl_2/O_2$), a gaseous mixture of hydrogen bromide and oxygen gas ($HBr/O_2$) or the like.

Then, a silicon anti-reflection film 116 and a photo resist (not shown) are formed on the silicon oxide film 108 so as to fill the etched polycrystalline silicon films 110a. Subsequently, an exposure/developing process is conducted for the photo resist (not shown) through a predetermined mask to form the second resist film 118 having an aperture 119 (FIG. 2A). The aperture 119 is opened in a region immediately above the unnecessary pattern transferred onto the polycrystalline silicon film 110.

Subsequently, portions of the anti-reflection film 116 and the polycrystalline silicon film 110a are etched off though a mask of the second resist film 118 to provide the polycrystalline silicon film 110 processed into a second pattern (FIG. 2B). With this process, the unnecessary parts of the polycrystalline silicon film 110a are removed. It means that portions of the pattern except the gate pattern to be formed are removed. As described above, larger etch selectivity of polycrystalline silicon film 110/silicon oxide film 108 can be achieved by employing the silicon oxide film 108. Therefore, the etch process can be conducted without creating any cutting in the film surface of the silicon oxide film 108.

Then, the remained resist film 118 and the anti-reflection film 116 are stripped off via an ordinary process.

Next, the silicon oxide film 108 is etched through a mask of the polycrystalline silicon film 110b (FIG. 3A). The etch selectivity of the silicon oxide film 108/polycrystalline silicon film 106 is obtained, and based on the etch selectivity, the etch process for the silicon oxide film 108 is conducted under the condition of less removal of the polycrystalline silicon film 106. Then, the polycrystalline silicon film 106 is etched through a mask of the silicon oxide film 108a to prepare a gate electrode 106a (FIG. 3B). The surface of the polycrystalline silicon film 106 is provided with no unexpected pattern formed thereon, and thus the etching is proceeded until the surface of the gate oxide film 104 is exposed.

Hereafter, wells, gate electrodes, diffusion layers or the like are prepared via an ordinary process to manufacture the semiconductor device.

Advantageous effects obtainable by employing the configuration of the present embodiment will be described. In the present embodiment, a transference of an unexpected pattern onto a silicon substrate can be inhibited, so that a semiconductor device, which provides an inhibition of a deterioration in properties such as a generation of a gate leakage current, a short-circuit and the like, can be manufactured.

On the contrary, when a silicon oxide film formed on a polycrystalline silicon film is employed for a monolayer mask as described in Japanese Patent Laid-Open No. 2000-227,652, it is difficult to achieve higher etch selectivity of a silicon oxide film/polycrystalline silicon film, where the etching rate for the silicon oxide should be relatively higher than that of the polycrystalline silicon film. Therefore, when an unnecessary pattern is removed from the mask-pattern formed in the silicon oxide film, exposed portions of the surface of the polycrystalline silicon film may be etched, causing a formation of an unwanted pattern. When, in turn, the polycrystalline silicon film is etched, the presence of such unwanted pattern may cause unwanted etching of the gate oxide film and the silicon substrate, causing a gate leakage current or a short-circuit in the obtained semiconductor device.

On the contrary, in the present embodiment, the second film (silicon oxide film 108) serves as an etch stop for etching the third film (polycrystalline silicon film 110), and further serves as a hard mask for etching the first film (polycrystalline silicon film 106). This prevents the formation of an unexpected pattern on the surface of the first film, and further, the first film can be etched through a mask of the second film having a predetermined pattern transferred thereon with an improved efficiency. Thus, such configuration can prevents the silicon substrate or the like from being transferred with an unexpected pattern. This achieves a manufacture of the semiconductor device that provides an inhibition of a deterioration in properties such as a generation of a gate leakage current, a short-circuit and the like, and thus a production yield of the finished product is improved.

Second Embodiment

Figure 4A:
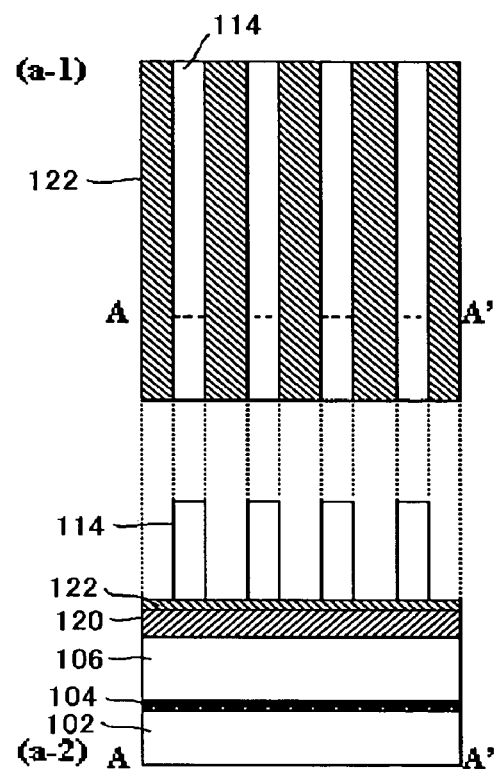
FIGS. 4A and 4B include plan views and cross-sectional views of a semiconductor device, illustrating a method for manufacturing the semiconductor device of second embodiment.
Figure 4B:
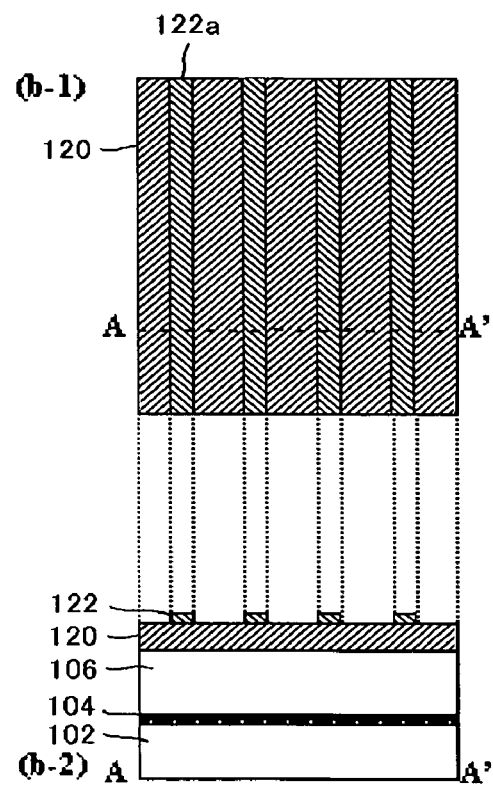
Figure 5A:
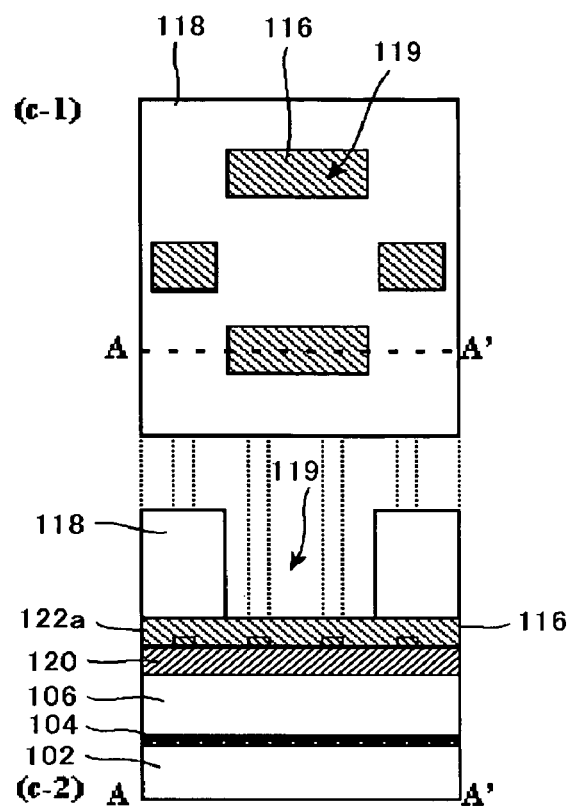
FIGS. 5A and 5B include plan views and cross-sectional views of the semiconductor device, illustrating the method for manufacturing the semiconductor device of second embodiment.
Figure 5B:
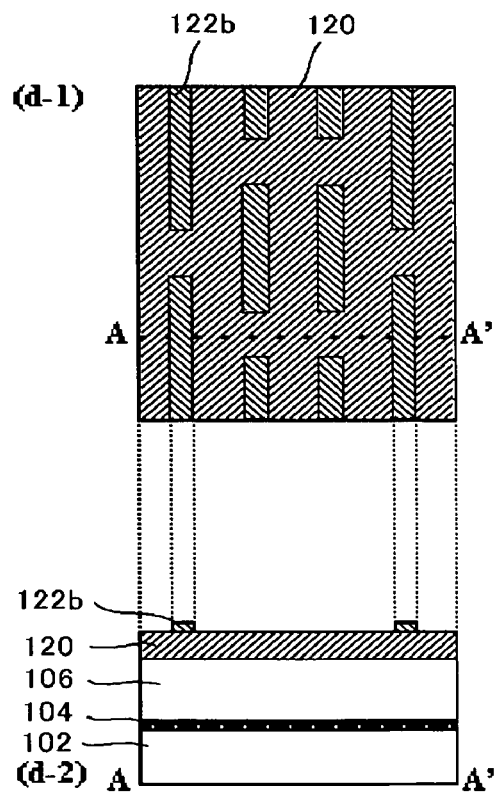
Figure 6:
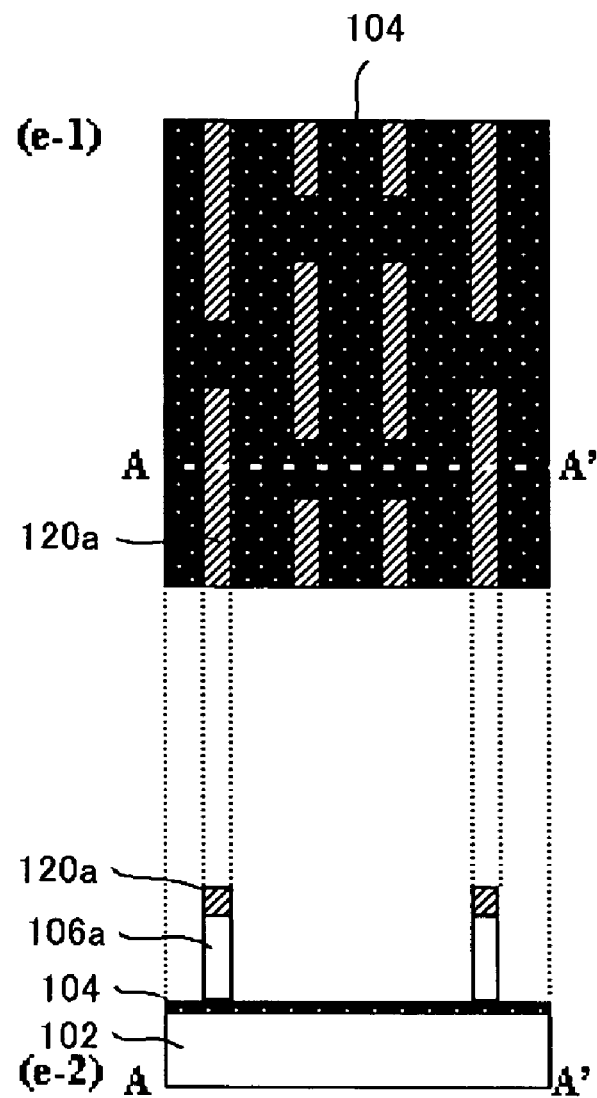
FIG. 6 includes a plan view and a cross-sectional view of the semiconductor device, illustrating the method for manufacturing the semiconductor device of second embodiment.

A method for manufacturing a semiconductor device of the present embodiment includes the following operations:

(i) forming a first film (polycrystalline silicon film 106), a second film (amorphous carbon film 120) and a third film (silicon oxycarbide [SiOC] film 122) in sequence on a silicon substrate 102 (FIG. 4A);

(ii) forming a resist film on the SiOC film 122 (FIG. 4A);

(iii) patterning the aforementioned resist film by conducting an exposure and developing process for the aforementioned resist film employing an exposure mask comprising a phase shifter (FIG. 4A);

(iv) selectively dry-etching the SiOC film 122 through a mask of the resist film 114 employing the amorphous carbon film 120 as an etch stop to process the polycrystalline silicon film 110 into a first pattern (FIG. 4B);

(v) further dry-etching the SiOC film 122 employing the amorphous carbon film 120 as an etch stop to partially remove the SiOC film 122, thereby processing the SiOC film 122 into a second pattern (FIGS. 5A and 5B);

(vi) patterning the amorphous carbon film 120 through a mask of the SiOC film 122b having the second pattern (FIG. 6); and (vii) patterning the polycrystalline silicon film 106 employing the patterned amorphous carbon film 120a as a mask (FIG. 6).

The present embodiment will be further described along respective operating steps as follows. Each of FIGS. 4A and 4B, FIGS. 5A and 5B and FIG. 6 contains a plan view [(a-1) to (e-1)] and a cross-sectional view [(a-2) to (e-2)] of a semiconductor device of the present embodiment, respectively, illustrating a method for manufacturing the semiconductor device of the present embodiment by respective process sequences.

As shown in FIG. 4A, a gate oxide film 104 and a polycrystalline silicon film 106 are sequentially deposited on the silicon substrate 102. Further, the amorphous carbon film 120 for forming a hard mask, the SiOC film 122 and a resist film (not shown) are formed thereon.

Then, the resist film is exposed and developed through a Levenson phase shifting mask (not shown) to form a patterned first resist film 114 (FIG. 4A). Next, the SiOC film 122 is selectively dry etched through a mask of the first resist film 114 employing the amorphous carbon film 120 as an etch stop to process the SiOC film 122 into the first pattern (FIG. 4B).

Larger etch selectivity of SiOC film 122/amorphous carbon film 120 can be achieved by optimizing the dry etch condition. This provides a selective etching of the SiOC film 122 without creating any cutting in the film surface of the amorphous carbon film 120. Typical etchant gases include, for example, a fluorocarbon-containing.

Then, an anti-reflection film 116 and a photo resist (not shown) are formed on the amorphous carbon film 120 so as to fill the etched SiOC film 122a. Subsequently, an exposure/developing process is conducted for the photo resist (not shown) through a predetermined mask to form the second resist film 118 having an aperture 119 (FIG. 5A). The aperture 119 is opened in a region immediately above the unnecessary pattern transferred onto the polycrystalline silicon film 110.

Subsequently, portions of the anti-reflection film 116 and the SiOC film 122a are etched off though a mask of the second resist film 118 to provide the SiOC film 122 processed into a second pattern (FIG. 5B). This removes portions of the pattern except the gate pattern to be formed. As described above, larger etch selectivity of SiOC film 122/amorphous carbon film 120 can be achieved by optimizing the dry etch condition. Therefore, the etch process can be conducted without creating any cutting in the film surface of the amorphous carbon film 120.

Then, the remained resist film 118 and the anti-reflection film 116 are stripped off via an ordinary process.

Next, the amorphous carbon film 120 is etched through a mask of the SiOC film 122b. The etch selectivity of amorphous carbon film 120/polycrystalline silicon film 106 is obtained, and based on the etch selectivity, the etch process for the amorphous carbon film 120 is conducted under the condition of less removal of the polycrystalline silicon film 106. Then, the polycrystalline silicon film 106 is etched through a mask of the etched amorphous carbon film 120a to prepare a gate electrode 106a (FIG. 6). The surface of the polycrystalline silicon film 106 is provided with no unexpected pattern formed thereon, and thus the etching is proceeded until the surface of the gate oxide film 104 is exposed.

Hereafter, wells, gate electrodes, diffusion layers or the like are prepared via an ordinary process to manufacture the semiconductor device.

Advantageous effects obtainable by employing the configuration of the present embodiment will be described. The advantageous effects obtainable by employing the configuration of first embodiment can be also obtained in the method for manufacturing the semiconductor device of the present embodiment. Further, SiOC film/amorphous carbon multiple-layered film is employed as an anti-reflection film in second embodiment, so that a reflection of light during the exposure would be inhibited, thereby providing an improved lithographic performance. Therefore, a desired pattern can be formed with an improved efficiency.

Third Embodiment

Figure 7A:
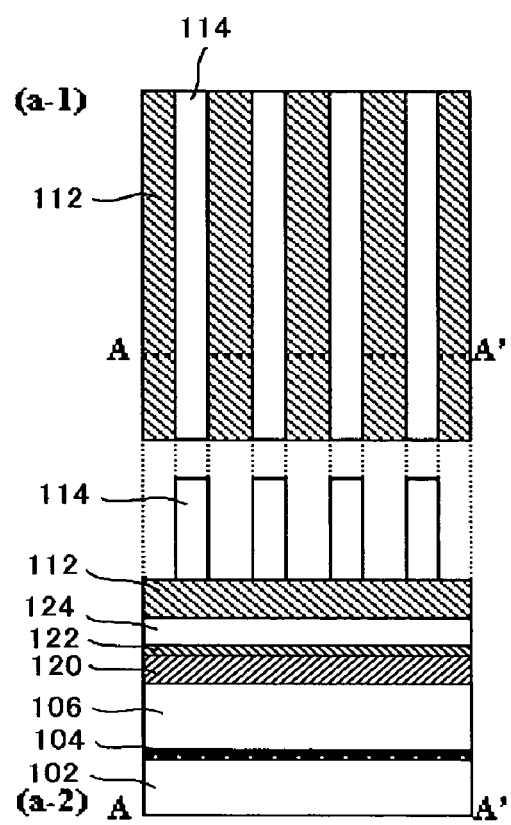
FIGS. 7A and 7B include plan views and cross-sectional views of a semiconductor device, illustrating a method for manufacturing the semiconductor device of third embodiment.
Figure 7B:
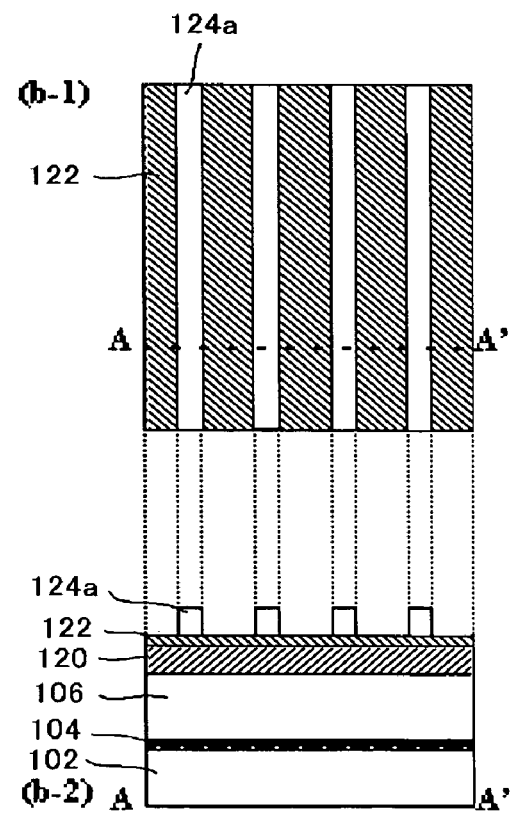
Figure 8A:
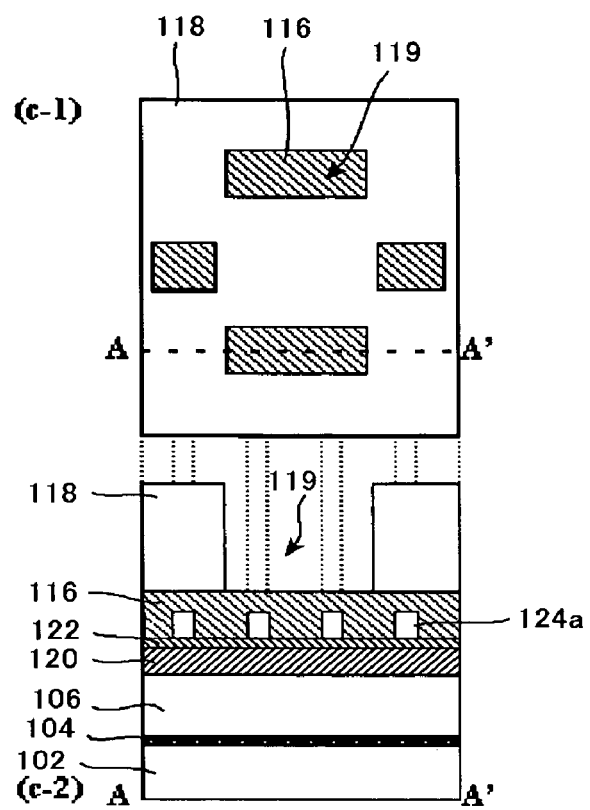
FIGS. 8A and 8B include plan views and cross-sectional views of the semiconductor device, illustrating the method for manufacturing the semiconductor device of third embodiment.
Figure 8B:
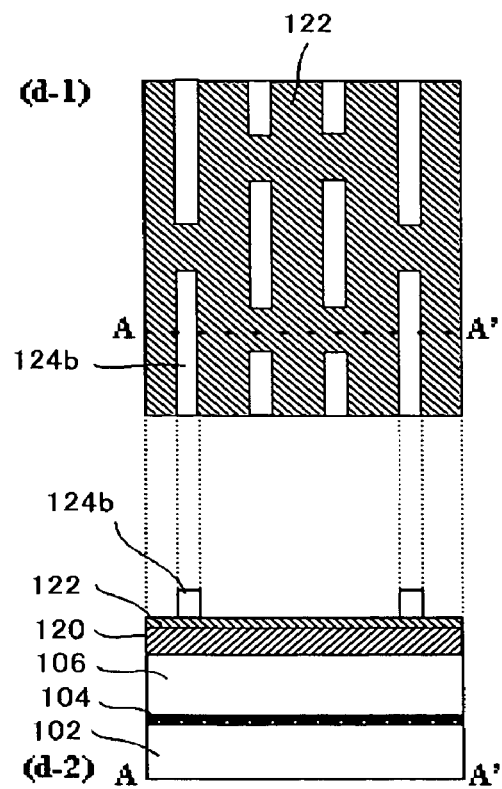
Figure 9:
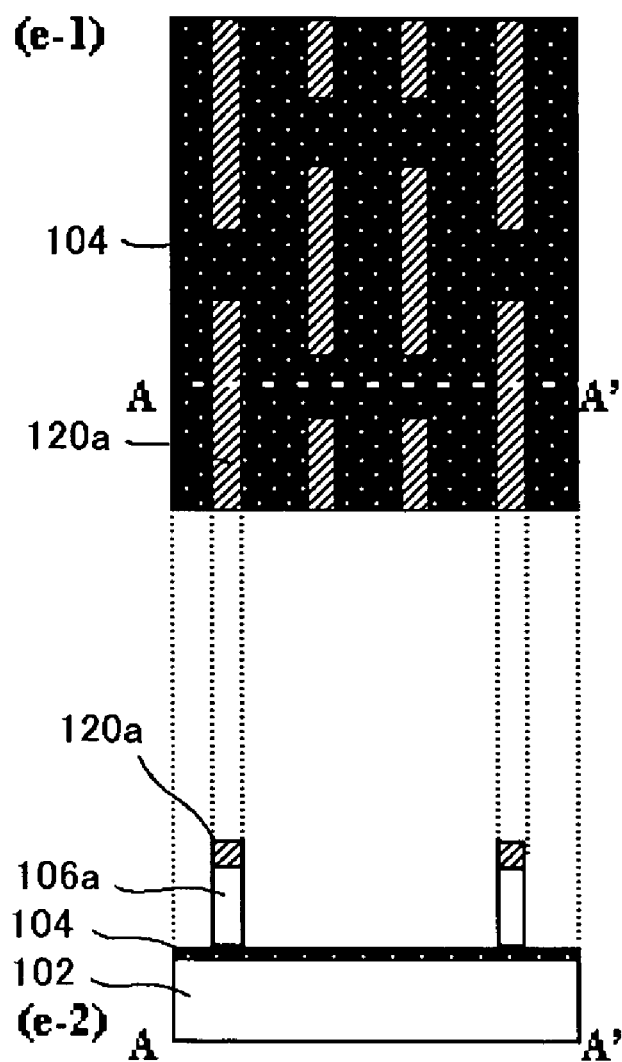
FIG. 9 includes a plan view and a cross-sectional view of the semiconductor device, illustrating the method for manufacturing the semiconductor device of third embodiment.
Figure 11A:
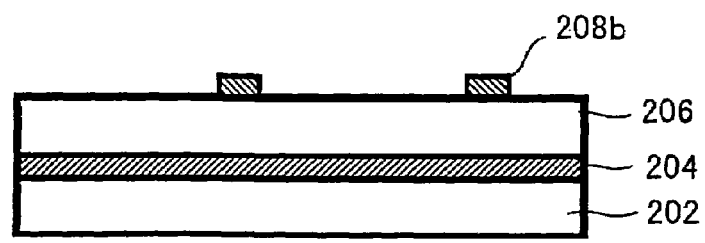
FIGS. 11A and 11B are cross-sectional views of the semiconductor device, illustrating the conventional process for manufacturing the semiconductor device.
Figure 11B:
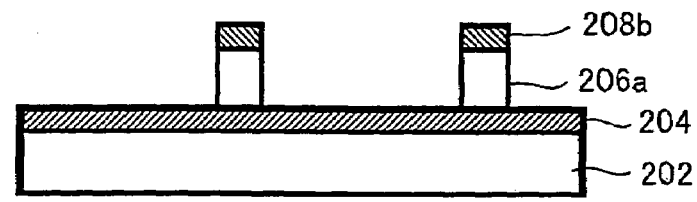
Figure 12A:
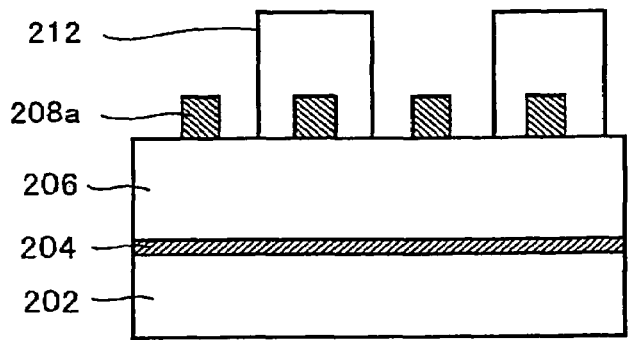
FIGS. 12A to 12D are cross-sectional views of a semiconductor device, illustrating a problem in a conventional process for manufacturing the semiconductor device.
Figure 12B:
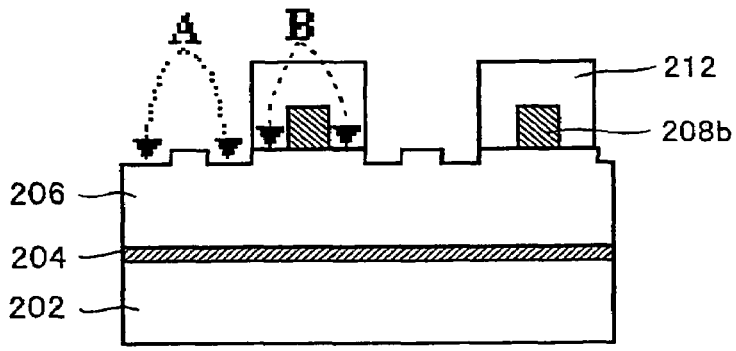
Figure 12C:
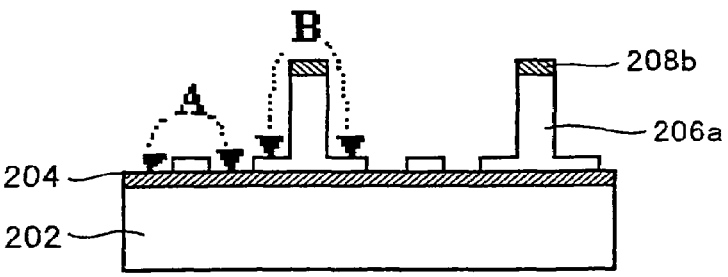
Figure 12D:
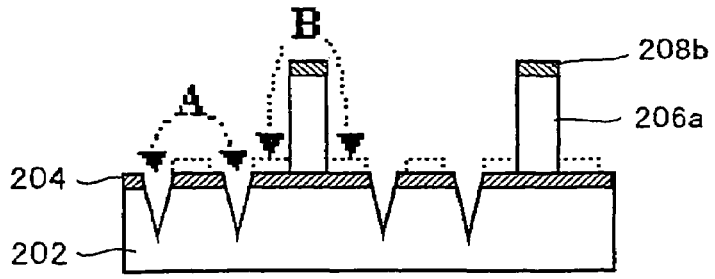

A method for manufacturing a semiconductor device of the present embodiment includes the following operations:

(i) forming a first film (polycrystalline silicon film 106), a second film (multiple-layered film of amorphous carbon film 120 and SiOC film 122) and a third film (silicon-containing film 124) in sequence on a silicon substrate 102 (FIG. 7A);

(ii) forming a resist film on the silicon-containing film 124 (FIG. 7A);

(iii) patterning the aforementioned resist film by conducting an exposure and developing process for the aforementioned resist film employing an exposure mask comprising a phase shifter (FIG. 7A);

(iv) selectively dry-etching the silicon-containing film 124 through a mask of the resist film 114 employing the SiOC film 122 as an etch stop to process the silicon-containing film 124 into a first pattern (FIG. 7B);

(v) further dry-etching the silicon-containing film 124a employing the SiOC film 122 as an etch stop to partially remove the silicon-containing film 124a, thereby processing the silicon-containing film 124a into a second pattern (FIGS. 8A and 8B);

(vi) patterning the aforementioned multiple-layered film through a mask of the silicon-containing film 124b having the second pattern (FIG. 9); and (vii) patterning the first film 106 employing the aforementioned patterned multiple-layered film as a mask (FIG. 9).

The present embodiment will be further described along respective operating steps as follows. Each of FIGS. 7A and 7B, FIGS. 8A and 8B and FIG. 9 contains a plan view [(a-1) to (e-1)] and a cross-sectional view [(a-2) to (e-2)] of a semiconductor device of the present embodiment, respectively, illustrating a method for manufacturing the semiconductor device of the present embodiment by respective process sequences.

As shown in FIG. 7A, a gate oxide film 104 and a polycrystalline silicon film 106 are sequentially deposited on the silicon substrate 102. Further, the multiple-layered film of amorphous carbon film 120 and SiOC film 122 for forming a hard mask, the silicon-containing film 124, an anti-reflection film 112 and a resist film (not shown) are formed thereon. Typical films employed for the silicon-containing film 124 may include an amorphous silicon film, a polysilicon film or the like.

Then, the resist film is exposed and developed through a Levenson phase shifting mask (not shown) to form a patterned first resist film 114 (FIG. 7A). Next, the anti-reflection film 112 and the polycrystalline silicon film 110 are selectively dry etched through a mask of the first resist film 114 employing the SiOC film 122 as an etch stop to process the silicon-containing film 124 into a first pattern (FIG. 7B).

In general, when a polysilicon etching apparatus is employed for the dry etch apparatus, larger etch selectivity of silicon-containing film 124/SiOC film 122 can be achieved. This provides an etching of the silicon-containing film 124 without creating any cutting in the film surface of the SiOC film 122. Typical etchant gases include, for example, a gaseous mixture of $Cl_2/O_2$, a gaseous mixture of $HBr/O_2$ or the like.

Then, an anti-reflection film 116 and a photo resist (not shown) are formed on the silicon oxide film 108 so as to fill the etched silicon-containing film 124a. Subsequently, an exposure/developing process is conducted for the photo resist (not shown) through a predetermined mask to form a second resist film 118 having an aperture 119 (FIG. 8A). The aperture 119 is opened in a region immediately above the unnecessary pattern transferred onto the silicon-containing film 124.

Subsequently, portions of the anti-reflection film 116 and the silicon-containing film 124a are etched off though a mask of the second resist film 118 to provide the silicon-containing film 124a processed into a second pattern (FIG. 8B). This removes portions of the pattern except the gate pattern to be formed. As described above, larger etch selectivity of silicon-containing film 124/SiOC film 122 can be achieved by employing the silicon-containing film 124. Therefore, the etch process can be conducted without creating any cutting in the film surface of the SiOC film 122.

Then, the remained resist film 118 and the anti-reflection film 116 are stripped off via an ordinary process.

Next, the SiOC film 122 and the amorphous carbon film 120 is etched through a mask of the silicon-containing film 124b. Then, the polycrystalline silicon film 106 is etched through a mask of the etched multiple-layered film to prepare a gate electrode 106a (FIG. 9). The surface of the polycrystalline silicon film 106 is provided with no unexpected pattern formed thereon, and thus the etching is proceeded until the surface of the gate oxide film 104 is etched.

Hereafter, wells, gate electrodes, diffusion layers or the like are prepared via an ordinary process to manufacture the semiconductor device.

Advantageous effects obtainable by employing the configuration of the present embodiment will be described. The advantageous effects obtainable by employing the configuration of first embodiment can be also obtained in the method for manufacturing the semiconductor device of the present embodiment. Further, in the present embodiment, the multiple-layered film (amorphous carbon film and SiOC film) is employed for the second film. Therefore, a function as an etch stop and a function as a hard mask required in the processing for the second film can be separated in the upper layer film and the lower layer film, respectively. This achieves an inhibition of a deterioration in properties such as a generation of a gate leakage current, a short-circuit and the like, and thus a production yield of the finished product is improved.

Further, the multiple-layered film is employed as the second film in third embodiment. Therefore, larger etch selectivity can be achieved in these films, providing an increased design flexibility.

While the configuration of employing the multiple-layered film of the amorphous carbon film 120 and the SiOC film 122 for the second film and the silicon-containing film 124 for the third film has been described in the above-described embodiments, combinations of ($SiO_x$/Si), (Si/$SiO_x$), (SiN/Si), (Si/SiN), (SiN/$SiO_x$), ($SiO_x$/SiN) or the like may be employed for the combination of the SiOC film 122 and the silicon-containing film 124, which are represented as (silicon-containing film 124/SiOC film 122). In the above-described combinations, X may be carbon (C), nitrogen (N), oxygen (O) or the like.

While the preferred embodiments of the present invention have been described above in reference to the annexed figures, it should be understood that the disclosures above are presented for the purpose of illustrating the present invention, and various configurations other than the above described configurations can also be adopted.

While the configuration of forming the gate pattern, for example, has been described in the above described embodiments, the present invention is not particularly limited thereto, and the present invention may also be applicable to a case, in which a damage of the film surface caused by the etching is to be inhibited. In such case, a single crystalline silicon films may also be employed for the first film, in addition to a polycrystalline silicon film.

Further, while the etch stop is configured of a single layer structure in first and second embodiments and the etch stop is configured of a dual layer structure in third embodiment, the present invention is not particularly limited thereto, and the etch stop may also be configured of a multiple-layered structure composed of three or more layers.

It is apparent that the present invention is not limited to the above embodiment, and may be modified and changed without departing from the scope and spirit of the invention.

What is claimed is:

1. A method for manufacturing a semiconductor device, comprising:

forming a first film, a second film and a third film in sequence on a silicon substrate, the first and third films being polycrystalline silicon and the second film including silicon oxide;

forming a resist film on said third film;

patterning said resist film by conducting an exposure and developing process for said resist film employing an exposure mask comprising a phase shifter;

selectively dry-etching said third film through a mask of said resist film employing said second film as an etch stop to process said third film into a first pattern;

further dry-etching said third film employing said second film as an etch stop to partially remove said third film, thereby processing said third film into a second pattern;

patterning said second film through a mask of said third film having said second pattern; and patterning said first film employing said patterned second film as a mask.

2. The method for manufacturing the semiconductor device according to claim 1, said patterning said first film includes processing the first film into a gate electrode geometry.

3. The method for manufacturing the semiconductor device according to claim 1, wherein said second film is a multiple-layered film.

4. The method for manufacturing the semiconductor device according to claim 2, wherein said second film is a multiple-layered film.

\* \* \* \* \*